United States Patent [19]

Sloane et al.

[11] Patent Number: 4,684,970
[45] Date of Patent: Aug. 4, 1987

[54] HIGH CURRENT LATERAL TRANSISTOR STRUCTURE

[75] Inventors: Maurice W. Sloane, Clinton, N.J.; Thomas V. Sikina, Doylestown, Pa.

[73] Assignee: RCA Corporation, Princeton, N.J.

[21] Appl. No.: 885,744

[22] Filed: Jul. 21, 1986

Related U.S. Application Data

[63] Continuation of Ser. No. 759,831, Jul. 29, 1985, abandoned.

[51] Int. Cl.[4] .................................. H01L 29/72
[52] U.S. Cl. ..................... 357/35; 357/48; 357/86
[58] Field of Search ................ 357/35, 80, 48

[56] References Cited

U.S. PATENT DOCUMENTS

| | | | |
|---|---|---|---|
| 4,027,325 | 5/1977 | Genesi | 357/86 |
| 4,117,507 | 9/1978 | Pacor | 357/86 |
| 4,125,853 | 11/1978 | Fulton et al. | 357/35 |
| 4,489,341 | 12/1984 | Mayrand | 357/86 |
| 4,544,940 | 10/1985 | Weaver et al. | 357/35 |

Primary Examiner—Edward J. Wojciechowicz
Attorney, Agent, or Firm—S. C. Corwin; B. E. Morris

[57] ABSTRACT

A high current lateral transistor for an integrated circuit device is disclosed. The emitter and collector regions extend into the base region for a distance of approximately one half the thickness of the base region. A second region of the same conductivity type as the collector, surrounds the collector and is spaced therefrom. The base contact shorts together this second region and the base region so that when the transistor goes into saturation excess current will not flow into the substrate.

8 Claims, 3 Drawing Figures 4,684,970

HIGH CURRENT LATERAL TRANSISTOR STRUCTURE

This is a continuation of application Ser. No. 759,831, filed 7/29/85 now abandoned.

This invention relates to high current lateral transistor structures for use in integrated circuit devices.

BACKGROUND OF THE INVENTION

Bipolar transistors of the type having structures which are commonly called lateral structures generally have relatively low current carrying capacity. There are many reasons for this. One such reason is that the emitter and collector regions are usually shallow with respect to the depth or thickness of their associated base region. This significantly limits the effective area of the semiconducting junctions which must accommodate current flow. Another reason necessarily results from the common usage of this type of transistor very near, or at, saturation. When the transistor is at saturation, the collector and emitter become very close to the same potential level. This results in the tendency for current to find a pathway into the substrate thereby adversely affecting the operation of other devices contained on the same IC substrate. To constrain current flow into the substrate to an acceptable level, the overall current flow through the device is reduced thereby reducing its usefulness in high power applications. What is needed is a transistor having the advantages of the lateral structure which will operate effectively at relatively high power levels.

SUMMARY OF THE INVENTION

According to the present invention a high current lateral transistor for use in an integrated circuit is disclosed having a substrate of a first conductivity type semiconducting material. A first layer of second conductivity type semiconducting material having a surface is disposed on the substrate. The first layer has a thickness extending from the surface to the substrate. A first region of highly doped first conductivity type is disposed within and in PN junction forming relation with the first layer and extends downwardly from the surface for a distance equal to a portion of the thickness.

A second region of highly doped first conductivity type is disposed within and in PN junction forming relation with the first layer. The second region is spaced from and surrounds the first region and extends downwardly from the surface for a distance equal to the portion of the thickness. A third region of highly doped first conductivity type is disposed within and in PN junction forming relation with the first layer. The third region is spaced from and surrounds the second region and extends downwardly from the surface.

A second layer of highly doped second conductivity type semiconducting material is disposed intermediate a portion of the substrate and the first layer and is spaced from and opposed to the first, second, and third regions. A fourth region of highly doped second conductivity type is disposed within the first layer and extends downwardly from the surface. A conductor means is included which electrically connects the third and fourth regions.

DESCRIPTION OF THE PREFERRED EMBODIMENT

Figure 1:
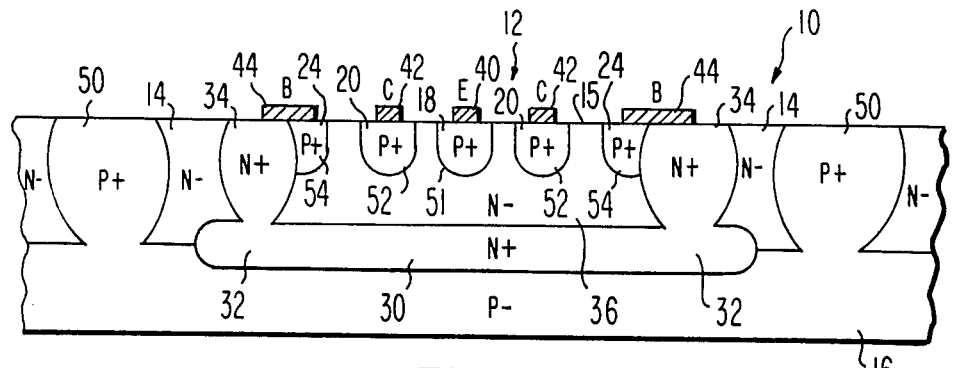
FIG. 1 is a schematic representation of a cross-sectional view of a portion of an integrated circuit device showing an embodiment of the present invention.
Figure 3:
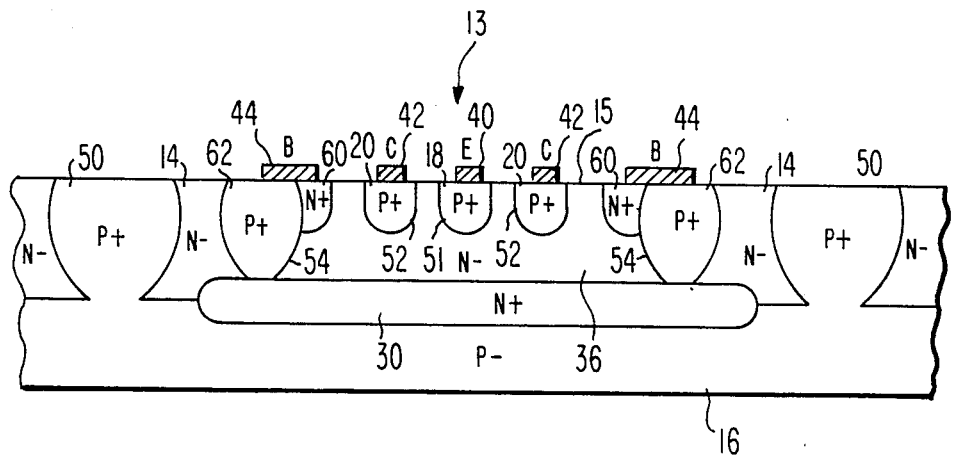
FIG. 3 is a view similar to that of FIG. 1 showing another embodiment of the present invention.

In the following description and as shown in FIGS. 1 and 3, specific P and N type conductivity materials are indicated. These indications are by way of example and shall not be deemed to limit the teachings of the present invention. It will be understood that devices having opposite P and N arrangements are considered equivalent in all pertinent respects to the devices described herein. PN and NP junctions are also referred to as semiconducting junctions, the terms being used interchangeably. The base, emitter, and collector connections of the device are indicated in FIGS. 1 and 3 by B, E, and C respectively.

FIG. 1 shows an integrated circuit device 10 having a lateral transistor 12 formed therein. A first layer 14 of second conductivity type semiconducting material having a surface 15 is disposed on a substrate 16 of a first conductivity type material. In the present example the first layer 14 is highly doped N type and the substrate 16 is lightly doped P type. The first layer 14 may be epitaxially grown as is commonly done in the industry. Alternatively, the first layer 14 may be a doped region formed in bulk semiconducting material in a manner that is well known in the art. While this alternate structure will not be described herein, it will be understood that the teachings of the present invention may be advantageously employed in such a structure and that such structures are considered within the spirit and scope of the present invention.

A first region 18 of first conductivity type, which is highly doped P type, is disposed in the first layer 14, as shown in FIG. 1, and forms the emitter of the transistor 12. A second region 20 of first conductivity type, which is highly doped P type, is also disposed in the first layer 14 and is formed as a ring which surrounds the first region 18. The second region 20 forms the collector of the transistor 12. Both the first and second regions 18 and 20 extend downwardly from the surface 15 for a distance equal to about one half the thickness of the first layer 14. That is, the first and second regions 18 and 20 extend to an area within the first layer that is about halfway between the surface 15 and the substrate 16. A third region 24 of first conductivity type material, which is highly doped P type, is also disposed in the first layer 14 and, similar to the second region 20, is formed as a ring. The third region 24, however, surrounds both the first and second regions 18 and 20 as shown in FIG. 1. The third region 24 extends downwardly from the surface 15 toward the substrate 16 for a distance similar to that of the first and second regions 18 and 20.

A second layer 30 of second conductivity type semiconducting material which is highly doped N type is disposed between the first layer 14 and the substrate 16 as shown in FIG. 1. The second layer 30 extends under the first, second, and third regions 18, 20, and 24 and beyond the third region a small amount as shown at 32. A fourth region 34, comprising a deep N+ diffusion, extends downwardly from the surface 15, through the first layer 14, and into electrical communication with the second layer 30 at 32. The fourth region 34, which permits electrical contact with the second layer 30 at the surface 15, may be a continuous annular shaped region which surrounds the third region 24, or the fourth region may be several individual subregions which are spaced from one another. The region 36 of the first layer 14 that is encircled by the fourth region 34 is the base of the transistor 12. Electrical contact to the base is made at the surface 15 through the fourth region 34 and the second layer 30 in a manner that is well known in the art.

The first, second, and third regions are formed relatively deep into the first layer 14 and are doped so that they have a resistance of from about 2 to 200 ohms per square, preferably from 10 to 40 ohms per square. This helps to assure relatively high current flow through the transistor 12. An emitter contact 40, collector contact 42, and base contact 44 are arranged in ohmic contact with the first, second, and fourth regions 18, 20, and 34 respectively at the surface 15 in the usual manner.

The transistor 12 is isolated from other transistors and devices contained in the integrated circuit device 10 by means of a fifth region 50 of first conductivity type, which is highly doped P type. The fifth region 50 extends from the surface 15 down through the first layer 14 into electrical communication with the substrate 16 and completely surrounds the transistor 12 in a manner that is well known in the art. It will be understood that while a single emitter 18 is shown, multiple such emitters may be utilized in a manner that is well known in the art thereby increasing current carrying capacity.

An important feature of the present invention is that the base contact 44 is in ohmic contact with both the third and fourth regions thereby shorting them together at the surface 15. This provides an arrangement whereby current may flow either between the first and second regions via their respective PNP junctions 51 and 52 or between the first and third regions via the PNP junctions 51 and 54. In the latter case, because the base contact 44 shorts the third and fourth regions together, under certain conditions current may flow between the first region 18, which is the emitter, and the fourth region 34 which connects to the base of the transistor 12. This occurs when the transistor 12 goes into saturation causing the relative potential of the second region 20 to be higher than that of the third region 29. Under these conditions excess current will be conducted between the emitter and base instead of flowing into the substrate 16 and potentially adversely affecting other devices on the same integrated circuit.

Figure 2:
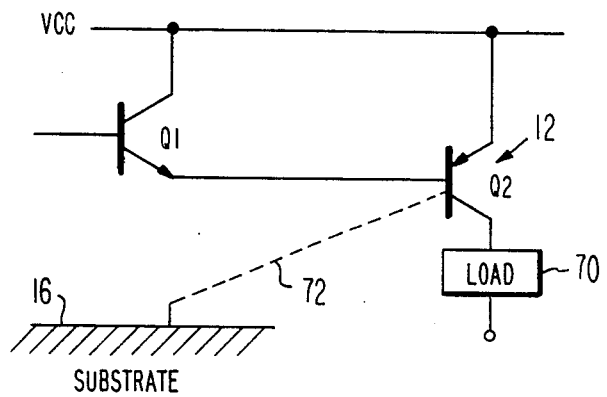
FIG. 2 is a schematic diagram representing a typical application of a high current lateral transistor structure as shown in FIG. 1.

FIG. 2 is a schematic diagram of a representative circuit containing the transistor 12, which is indicated as Q2, illustrating the teachings of the present invention.

The circuit includes a pair of transistors Q1 and Q2 which are used in this illustration to drive the arbitrary load 70. This is a typical application where the transistor Q2 is either off or fully on, that is, the voltage between the emitter and collector is at a maximum (VCC) or the voltage is at a minimum and the transistor is in saturation.

Since Q2 is a PNP transistor there is a parasitic current path 72 between the emitter and the substrate 16. When Q2 is in saturation the voltage between the emitter and the substrate is substantially higher than the voltage between the emitter and the collector. This results in current flow between the emitter and substrate which may increase circuit current and provide unwanted forward biasing of other parasitic components on the integrated circuit. This of course may cause circuit malfunction or even destruction.

The advantage of the present invention is that this unwanted current flow is redirected harmlessly through the region 24 to the base of Q2.

FIG. 3 shows a transistor 13 which illustrates another embodiment of the transistor 12 shown in FIG. 1. In both embodiments, the elements having the same identifying numbers are substantially identical. The device depicted in FIG. 3, however, includes a sixth region 60 of second conductivity type which is disposed in the first layer 14 and is formed as a ring which surrounds both the first and second regions 18 and 20. As shown in FIG. 3, the sixth region 60 extends downwardly from the surface 15 toward the substrate 16 for a distance similar to that of the first and second regions 18 and 20. Electrical contact to the base is made at the surface 15 through the sixth region 60. Alternatively, the sixth region 60 may be several individual subregions which are spaced from one another. A seventh region 62 of first conductivity type is disposed in the first layer 14 and is also formed as a ring which surrounds the sixth region 60 as shown in FIG. 3. The seventh region 62 is highly doped P type and extends from the surface 15 downwardly toward the substrate 16 and into contact with the second layer 30. The base contact 44 is arranged in ohmic contact with both the sixth and seventh regions 60 and 62 at the surface 15, thereby shorting them together. This shorting of the two regions prevents formation of a PN junction between the second layer 30 and the seventh region 62. The sixth and seventh regions 60 and 62 are analogous to and serve functions similar to the third and fourth regions 24 and 35 of the embodiment shown in FIG. 5.

As with the transistor 12, when the transistor 13 goes into saturation, excess current will be conducted between the first and seventh regions instead of flowing into the substrate 16 and potentially adversely affecting other devices on the same integrated circuit.

We claim:

1. A high current lateral bipolar transistor for use in an integrated circuit comprising:

(a) a substrate of a first conductivity type semiconducting material;

(b) a first layer of a second conductivity type semiconducting material disposed on said substrate having a surface and a thickness extending from said surface to said substrate;

(c) a first region, being an emitter of said transistor, of highly doped first conductivity type disposed within and in PN junction forming relation with said first layer and extending downwardly from said surface for a distance equal to a portion of said thickness;

(d) a second region, being a collector of said transistor, of highly doped first conductivity type disposed within and in PN junction forming relation with said first layer spaced from and surrounding said first region and extending downwardly from said surface for a distance equal to said portion of said thickness;

(e) a third region of highly doped first conductivity type disposed within and in PN junction forming relation with said first layer spaced from and surrounding said second region and extending downwardly from said surface;

(f) a second layer of highly doped second conductivity type semiconducting material intermediate a portion of said substrate and said first layer and being spaced from and opposed to said first, second, and third regions;

(g) a fourth region of highly doped second conductivity type disposed within said first layer extending downwardly from said surface; and (h) conductor means for electrically connecting said third and four regions, wherein said third region is adapted to conduct excess current between said first region and said fourth region.

2. The transistor set forth in claim 1 wherein said first, second, and third regions and said first layer have relative doping levels so that when said transistor is in saturation, current will flow between said first and third regions thereby negating current flow between said transistor and said substrate.

3. The transistor set forth in claim 2 wherein said portion of said thickness is about one half of said thickness of said first layer.

4. The transistor set forth in claim 3 wherein said third region extends downwardly from said surface for a distance about equal to said portion of said thickness.

5. The transistor set forth in claim 4 wherein said third region extends downwardly from said surface for a distance greater than the distance to which the first and second regions extend and surrounds said first, second, and fourth regions.

6. The transistor set forth in claim 4 wherein said fourth region extends downwardly from said surface into electrical communication with said second layer.

7. The transistor set forth in claim 6 wherein said first, second, and third regions are of P type conductivity having an electrical resistance of from about 2 to 200 ohms per square.

8. The transistor set forth in claim 7 including a fifth region of highly doped P type conductivity extending downwardly from said surface into electrical communication with said substrate, said fifth region surrounding said first, second, third, and fourth regions.

* * * * *